United States Patent
Yajima et al.

(10) Patent No.: US 10,566,511 B2
(45) Date of Patent: Feb. 18, 2020

(54) LIGHT-EMITTING DEVICE AND METHOD OF MANUFACTURING THE SAME

(71) Applicant: TOYODA GOSEI CO., LTD., Kiyosu-shi (JP)

(72) Inventors: Takayoshi Yajima, Kiyosu (JP); Hiroshi Ito, Kiyosu (JP); Seiji Yamaguchi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/619,311

(22) Filed: Jun. 9, 2017

(65) Prior Publication Data
US 2018/0053883 A1 Feb. 22, 2018

(30) Foreign Application Priority Data

Aug. 22, 2016 (JP) .................. 2016-161811

(51) Int. Cl.
*H01L 33/62* (2010.01)
*H01L 33/48* (2010.01)
*H01L 33/50* (2010.01)
*H01L 33/60* (2010.01)

(52) U.S. Cl.
CPC ............ *H01L 33/62* (2013.01); *H01L 33/486* (2013.01); *H01L 33/505* (2013.01); *H01L 33/60* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| | | | | |
|---|---|---|---|---|
| 7,589,351 B2* | 9/2009 | Hsieh | .................. | H01L 33/38 257/100 |
| 8,008,674 B2* | 8/2011 | Nawashiro | .......... | G02B 6/0021 257/72 |
| 8,089,087 B2* | 1/2012 | Lee | ....................... | H01L 33/483 257/100 |

(Continued)

FOREIGN PATENT DOCUMENTS

| JP | 2014-003260 A | 6/2009 |
|---|---|---|
| JP | 2009-141030 A | 9/2009 |

(Continued)

*Primary Examiner* — Eric A. Ward
(74) *Attorney, Agent, or Firm* — McGinn I.P. Law Group, PLLC.

(57) ABSTRACT

A light-emitting device includes a circuit board including a wiring on a surface of a substrate, the wiring including a raised portion, and a light-emitting element mounted on the raised portion. When the light-emitting element is of a flip-chip type, an element electrode thereof is connected to the raised portion such that an edge of the element electrode on an outer periphery side of the light-emitting element is located outside of the raised portion in a top view and an exposed portion of the element electrode is covered with a white or transparent resin. When the light-emitting element is of a face-up type, an element substrate thereof is bonded to the raised portion such that the raised portion is located inside the element substrate in the top view and an exposed portion of a bottom surface of the element substrate is covered with a white resin.

20 Claims, 6 Drawing Sheets (56) References Cited

U.S. PATENT DOCUMENTS

| | | | |
|---|---|---|---|
| 8,203,218 B2* | 6/2012 | Kim | H01L 33/641 |
| | | | 257/676 |
| 8,212,272 B2* | 7/2012 | Oyamada | H01L 33/486 |
| | | | 257/98 |
| 9,368,702 B2 | 6/2016 | Bierhuizen | |
| 2012/0061706 A1* | 3/2012 | Kamada | H01L 24/32 |
| | | | 257/98 |
| 2013/0001632 A1* | 1/2013 | Imai | H01L 33/62 |
| | | | 257/99 |
| 2013/0009190 A1* | 1/2013 | Memida | H01L 33/486 |
| | | | 257/98 |
| 2014/0014992 A1* | 1/2014 | Tsuchiya | H01L 33/60 |
| | | | 257/98 |
| 2014/0346533 A1* | 11/2014 | Andrews | H01L 25/0753 |
| | | | 257/88 |
| 2015/0021642 A1 | 1/2015 | Nakabayashi | |
| 2015/0349231 A1* | 12/2015 | Hsieh | H01L 33/642 |
| | | | 257/98 |
| 2016/0308101 A1* | 10/2016 | Konishi | H01L 33/60 |
| 2016/0329469 A1* | 11/2016 | Langer | H01L 33/62 |
| 2017/0194540 A1* | 7/2017 | Liu | H01L 33/38 |

FOREIGN PATENT DOCUMENTS

| | | |
|---|---|---|
| JP | 4366934 B2 | 11/2009 |
| JP | 2001-223391 A | 5/2012 |
| JP | 2012-089539 A | 5/2012 |
| JP | 2013-012544 A | 1/2013 |
| JP | 2014-022491 A | 2/2014 |
| JP | 14-225600 A | 12/2014 |

* cited by examiner

FIG.6B ously dropping onto the electrodes and disrupting device operation?

LIGHT-EMITTING DEVICE AND METHOD OF MANUFACTURING THE SAME

The present application is based on Japanese patent application No. 2016-161811 filed on Aug. 22, 2016, the entire contents of which are incorporated herein by reference.

BACKGROUND OF THE INVENTION

1. Field of the Invention

The invention relates to a light-emitting device and a method of manufacturing the light-emitting device.

2. Description of the Related Art

An optical module is known in which a light-emitting element is connected to electrodes of a circuit board etc. via metal bumps (see e.g. JP-B-4366934).

Also, a light-emitting device is known in which a flip-chip LED die is connected to a raised portion of a lead frame (see e.g. JP-A-2014-22491). In the light-emitting device, a certain space is provided between a semiconductor layer of the LED die and the upper surface of the lead frame and migration is thereby suppressed.

Also, another light-emitting device is known in which a flip-chip light emitting element is connected to raised portions of connection terminals on a base surface via a solder and the side surfaces of the light-emitting element are covered with a light reflective member (see, e.g., JP-A-2015-38963). In case of the light-emitting device of JP-A-2015-38963, even when a molten solder flows down from the raised portions during mounting of the light-emitting element, the molten solder is likely to stay around the raised portions and it is thus possible to prevent a pair of connection terminals from short-circuiting and the solder from entering an unintended region.

Also, an LED module is known in which two types of flip-chip packaged LED are mounted on a module substrate and a gap between the two packaged LEDs is filled with a white reflective member (see, e.g., JP-A-2014-225600).

Also, a light-emitting device is known which has a molded resin with an embedded lead electrode and a flip-chip light-emitting element connected to a raised portion of the lead electrode which is exposed on the bottom in an opening of the molded resin (see e.g. JP-A-2009-141030).

Also, lighting equipment is known which has a flexible printed circuit board having a reflector layer on a surface and an LED light-emitting element mounted in an opening of the flexible printed circuit board (see, e.g., JP-A-2014-3260).

Also, a method of manufacturing an LED package is known in which a phosphor-containing lens material is molded on an LED chip which is then mounted on a substrate (see e.g. JP-A-2015-507371).

SUMMARY OF THE INVENTION

As for the light-emitting devices with the light-emitting element mounted on the substrate, when filling a gap between the substrate and the flip-chip light-emitting element with an underfill, the gap between the substrate and the flip-chip light-emitting element may not be properly filled with the underfill since the gap is small, and electrodes of the light-emitting element may not be protected sufficiently.

Also, when applying a resist to cover the surface of the substrate, a wiring may be exposed in the vicinity of the light-emitting element in a region in which a white resin as a resist is not applied. This causes a decrease in luminous flux of the light-emitting device since reflectance of the wiring is lower than that of the white resin.

It is an object of the invention to provide a light-emitting device that is configured so as to fill a resin as the underfill to sufficiently protect the electrodes of a flip-chip light-emitting element, or that is configured so as to apply a resist without exposing a wiring in the vicinity of a face-up light-emitting element and by preventing the resist from climbing on the light-emitting element, as well as a method of manufacturing the light-emitting device.

According to embodiments of the invention, a light-emitting device defined by [1] to [4] below and a method of manufacturing the light-emitting device defined by [5] to [8] below are provided.

[1] A light-emitting device, comprising:

a circuit board comprising a wiring on a surface of a substrate, the wiring comprising a raised portion; and a light-emitting element mounted on the raised portion, wherein, when the light-emitting element is of a flip-chip type, an element electrode of the light-emitting element is connected to the raised portion such that an edge of the element electrode on an outer periphery side of the light-emitting element is located outside of the raised portion in a top view and an exposed portion of the element electrode in a vicinity of the outer periphery of the light-emitting element is covered with a white or transparent resin, and wherein, when the light-emitting element is of a face-up type, an element substrate of the light-emitting element is bonded to the raised portion such that the raised portion is located inside the element substrate in the top view and an exposed portion of a bottom surface of the element substrate is covered with a white resin.

[2] The light-emitting device according to [1], wherein, when the light-emitting element is of the flip-chip type, upper and side surfaces of the light-emitting element are covered with a phosphor layer.

[3] The light-emitting device according to [1] or [2], wherein, when the light-emitting element is of the flip-chip type, the wiring further comprises an other raised portion that constitutes a sidewall of a groove as well as the raised portion.

[4] The light-emitting device according to [3], wherein the other raised portion is provided on an edge of the wiring where the raised portion is not provided.

[5] A method of manufacturing a light emitting device, comprising:

forming a raised portion in a wiring on a surface of a circuit board; and mounting a light-emitting element on the raised portion, wherein, when the light-emitting element is of a flip-chip type, an element electrode of the light-emitting element is connected to the raised portion such that an edge of the element electrode on an outer periphery side of the light-emitting element is located outside of the raised portion in a top view and an exposed portion of the element electrode in a vicinity of the outer periphery of the light-emitting element is covered with a white or transparent resin, and wherein, when the light-emitting element is of a face-up type, an element substrate of the light-emitting element is bonded to the raised portion such that the raised portion is located inside the element substrate in the top view and an exposed portion of a bottom surface of the element substrate is covered with a white resin.

[6] The method according to [5], wherein, when the light-emitting element is of the flip-chip type, further comprising covering upper and side surfaces of the light-emitting element with a phosphor layer.

[7] The method according to [5] or [6], wherein, when the light-emitting element is of the flip-chip type, further comprising forming in the wiring an other raised portion that constitutes a sidewall of a groove as well as the raised portion.

[8] The method according to [7], wherein the other raised portion is provided on an edge of the wiring where the raised portion is not provided.

Effects of the Invention

According to an embodiment of the invention, a light-emitting device can be provided that is configured so as to fill a resin as the underfill to sufficiently protect the electrodes of a flip-chip light-emitting element, or that is configured so as to apply a resist without exposing a wiring in the vicinity of a face-up light-emitting element and by preventing the resist from climbing on the light-emitting element, as well as a method of manufacturing the light-emitting device.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Configuration of Light-Emitting Device

Figure 1A:
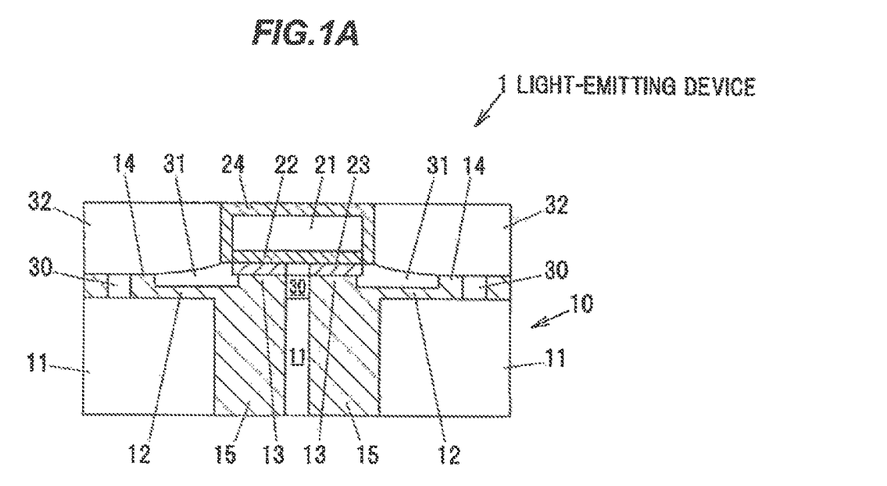
FIG. 1A is a vertical cross-sectional view showing a light-emitting device in the first embodiment.

FIG. 1A is a vertical cross-sectional view showing a light-emitting device 1 in the first embodiment.

The light-emitting device 1 has a circuit board 10 in which wirings 12 each having a raised portion 13 are provided on a surface of a substrate 11, a flip-chip light-emitting element 20 mounted on the raised portions 13 of the wirings 12, and a resin 31 as an underfill which fills a gap between the circuit board 10 and the light-emitting element 20. A sealing resin 32 may be provided on the resin 31 so as to cover the side surfaces of the light-emitting element 20.

Figure 1B:
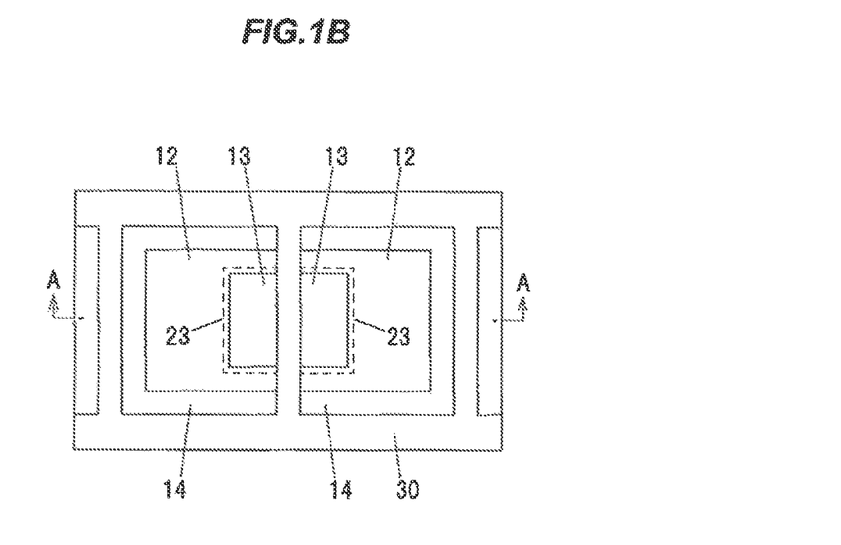
FIG. 1B is a top view showing the light-emitting device in the first embodiment.

FIG. 1B is a top view showing the light-emitting device 1 in the first embodiment. The cross section in FIG. 1A is taken on line A-A of FIG. 1B. FIG. 1B shows the state before arranging the light-emitting element 20, the resin 31 and the sealing resin 32. In addition, the positions where element electrodes 23 of the light-emitting element 20 are to be located are indicated by dotted lines in FIG. 1B.

The light-emitting element 20 is, e.g., a flip-chip LED chip which has an element substrate 21, a crystal layer 22 having cladding layers and a light-emitting layer sandwiched therebetween, and element electrodes 23 connected to the crystal layer 22. The light-emitting element 20 is mounted with the crystal layer 22 facing toward the circuit board 10, so that the element electrodes 23 are connected to the raised portions 13 of the wirings 12 via a conductive connecting member (not shown) such as bumps or conductive paste. Alternatively, the light-emitting element 20 may be a light-emitting element other than LED chip and may be, e.g., a laser diode, etc.

The substrate 11 is, e.g., a ceramic substrate such as $Al_2O_3$ substrate or AlN substrate, or a glass epoxy substrate. The wiring 12 is formed of a conductive material such as copper.

The wirings 12 have the raised portions 13 to be connected to the element electrodes 23 of the light-emitting element 20, as described above. A level difference between the light-emitting element 20 and the wiring 12 except the raised portion 13 is increased by mounting the light-emitting element 20 on the raised portions 13. In addition, the portions 13 are located inside the light-emitting element 20 when viewed from the top and gaps are thus formed between the element electrodes 23 and the wirings 12 on the outer periphery side of the light-emitting element 20.

This makes easy to fill the gap between the light-emitting element 20 and the circuit board 10 with the resin 31 while preventing the resin 31 from climbing on the light-emitting element 20.

In addition, as shown in FIGS. 1A and 1B, each element electrode 23 is arranged so that edges on the outer periphery side of the light-emitting element 20 are located outside of the raised portion 13 when viewed from the top. In other words, a portion of the element electrode 23 along the outer periphery of the light-emitting element 20 protrudes from the raised portion 13 toward the outside of the light-emitting element 20. Therefore, an exposed portion of each element electrode 23 in the vicinity of the outer periphery of the light-emitting element 20 can be easily covered with the resin 31. The feature in this case is that the side surfaces and a portion of the lower surface of each element electrode 23 exposed on the outer periphery side of the light-emitting element 20 are covered with the resin 31. Normally, the side surfaces of the raised portion 13 are also covered with the resin 31.

Damage caused by contact with the air (corrosion damage, etc.) can be prevented by covering the exposed portions of the element electrodes 23 with the resin 31. The resin 31 also improves bonding strength between the circuit board 10 and the light-emitting element 20.

The resin 31 is formed of, e.g., a resin such as silicone-based resin or epoxy-based resin. The resin 31 may be a white resin containing white filler. In this case, the resin 31 serves as a reflector and improves light extraction efficiency from the light-emitting element 20. Meanwhile, when the resin 31 is a transparent resin which does not contain a filler, the resin 31 can flow in a narrower gap and it is thus easy to fill the gap between the circuit board 10 and the light-emitting element 20 with the resin 31 when the gap is narrow.

When Au bumps are used to connect the element electrodes 23 of the light-emitting element 20 to the raised portions 13 of the wirings 12, gaps between the light-emitting element 20 and the wirings 12 are increased since the Au bumps, due to its nature, are formed thicker than other conductive connecting members, and it is thus easier to fill the gap between the circuit board 10 and the light-emitting element 20 with the resin 31.

The wiring 12 may have another raised portion 14 which, together with the raised portion 13, constitutes the sidewalls of a groove, as shown in FIGS. 1A and 1B. Since the raised portion 14 is provided, the wiring 12 has a groove of which sidewalls are formed by the raised portions 13 and 14, the resin 31 flows into the groove and it is thus easy to fill the gap between the circuit board 10 and the light-emitting element 20 with the resin 31.

In the example shown in FIGS. 1A and 1B, vias 15 penetrating the substrate 11 in the thickness direction thereof are connected to the wirings 12, and each raised portion 14 is provided along the edges of the wiring 12 except the edge with the raised portion 13.

In addition, the upper and side surfaces of the light-emitting element 20 may be covered with a phosphor layer 24, as shown in FIG. 1A. In this case, since a gap is also present between the phosphor layer 24 and the wirings 12 and makes difficult to fill the gap between the circuit board 10 and the light-emitting element 20 with the resin 31, the effect of the present embodiment to easily fill the gap with the resin 31 is more significant.

The phosphor layer 24 is formed of, e.g., a transparent member such as a resin containing dispersed phosphor particles. The fluorescence color of the phosphor contained in the phosphor layer 24 is not specifically limited. The light-emitting element 20 serves as the light source for excitation of the phosphor contained in the phosphor layer 24, and the emission color of the light-emitting device 1 is a mixture of the emission color of the light-emitting element 20 and the emission color of the phosphor layer 24. When, for example, the emission color of the light-emitting element 20 is blue and the emission color of the phosphor layer 24 is yellow, then the emission color of the light-emitting device 1 is white.

The sealing resin 32 is formed of, e.g., a resin such as silicone-based resin or epoxy-based resin. The sealing resin 32 may be a white resin containing white filler. In this case, the sealing resin 32 serves as a reflector. When the sealing resin 32 is a transparent resin, the sealing resin 32 preferably has a lower refractive index than the phosphor layer 24 to improve light extraction efficiency. In addition, when the sealing resin 32 is formed of a transparent resin, the sealing resin 32 may contain a phosphor.

When it is difficult to fill thin gaps between adjacent wirings 12, particularly a gap under the light-emitting element 20, with the resin 31 or the sealing resin 32, such gaps may be filled with a resin 30 before mounting the light-emitting element. The resin 30 may be the same resin as the resin 31 or the sealing resin 32.

Method of Manufacturing the Light-Emitting Device

An example of the method of manufacturing the light-emitting device 1 will be described below.

FIGS. 2A to 2D and 3A to 3D are vertical cross-sectional views showing a process of manufacturing the light-emitting device 1 in the first embodiment.

Figure 2A:
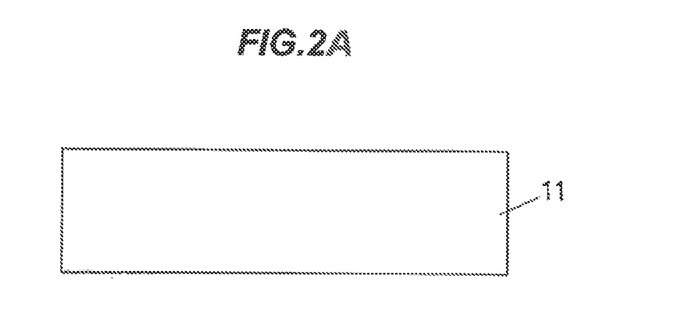
FIGS. 2A to 2D are vertical cross-sectional views showing a process of manufacturing the light-emitting device in the first embodiment.

Firstly, as shown in FIG. 2A, the substrate 11 is prepared.

Figure 2B:
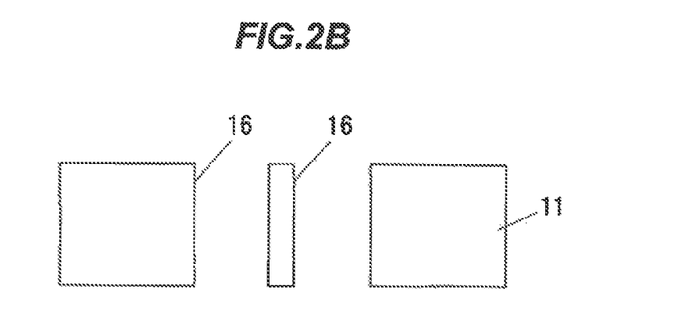

Next, as shown in FIG. 2B, via holes 16 are formed on the substrate 11 by etching, etc.

Figure 2C:
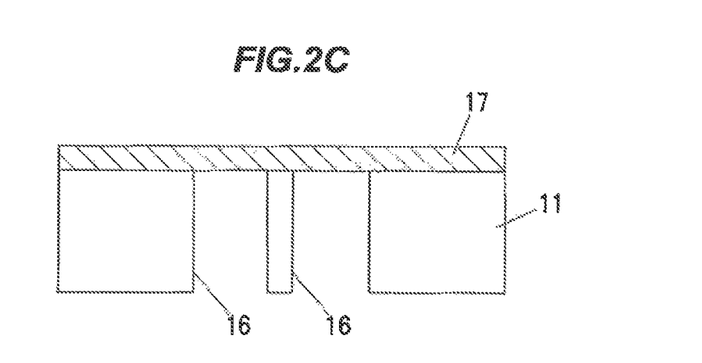

Next, as shown in FIG. 2C, a metal film 17 such as Cu film is bonded onto the surface of the substrate 11.

Figure 2D:
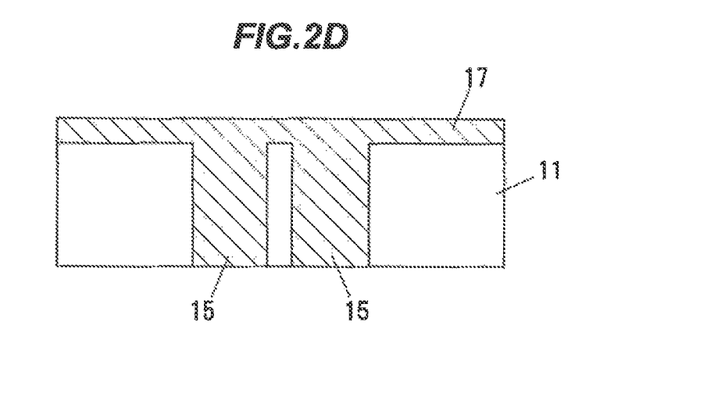

Next, as shown in FIG. 2D, the vias 15 are formed in the via holes 16 by Cu plating, etc.

Figure 3A:
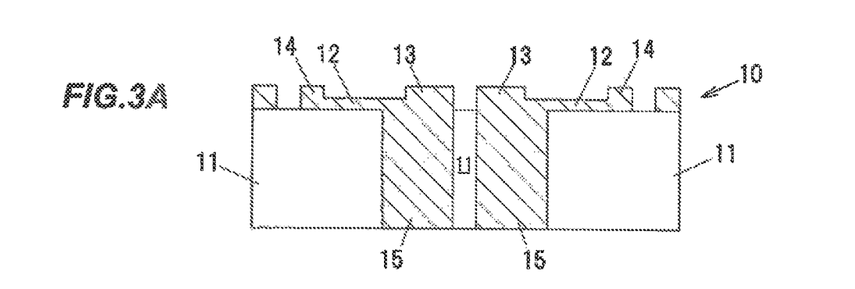
FIGS. 3A to 3D are vertical cross-sectional views showing the process of manufacturing the light-emitting device in the first embodiment.

Next, as shown in FIG. 3A, the metal film 17 is processed by etching, etc., to form the wirings 12. The raised portions 13 and 14 of the wirings 12 are formed in this step.

Figure 3B:
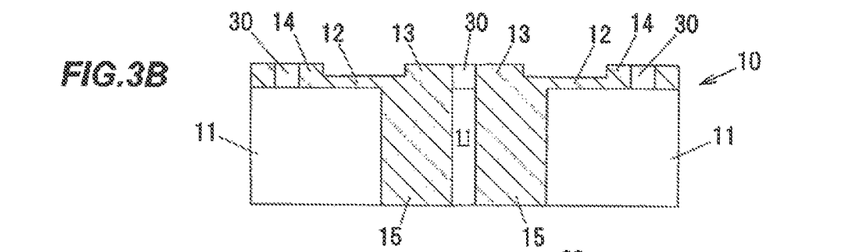

Next, as shown in FIG. 3B, the gaps between adjacent wirings 12 are filled with the resin 30 by potting, etc.

Figure 3C:
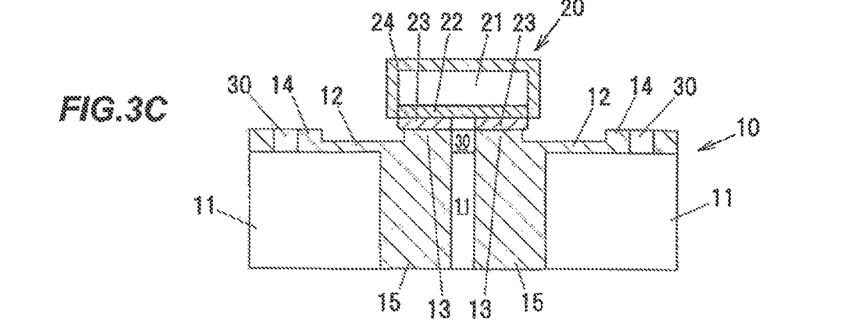

Next, as shown in FIG. 3C, the light-emitting element 20 is mounted on the raised portions 13 of the wirings 12.

Figure 3D:
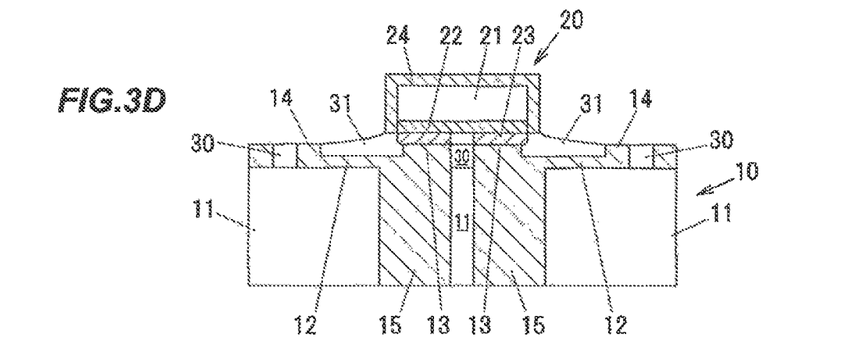

Next, as shown in FIG. 3D, a gap between the circuit board 10 and the light-emitting element 20 is filled with the resin 31 as an underfill by potting, etc.

After that, the sealing resin 32 is formed on the resin 31 by potting, etc., and the light-emitting device 1 is thereby obtained.

Effects of the First Embodiment

In the first embodiment, it is possible to fill a gap with a resin as an underfill so that element electrodes of a flip-chip light-emitting element can be protected sufficiently. As a result, it is possible to prevent corrosion damage, etc., of the element electrodes caused by exposure to open air and thereby to suppress a decrease in reliability of the light-emitting device.

Second Embodiment

Configuration of Light-Emitting Device

Figure 4A:
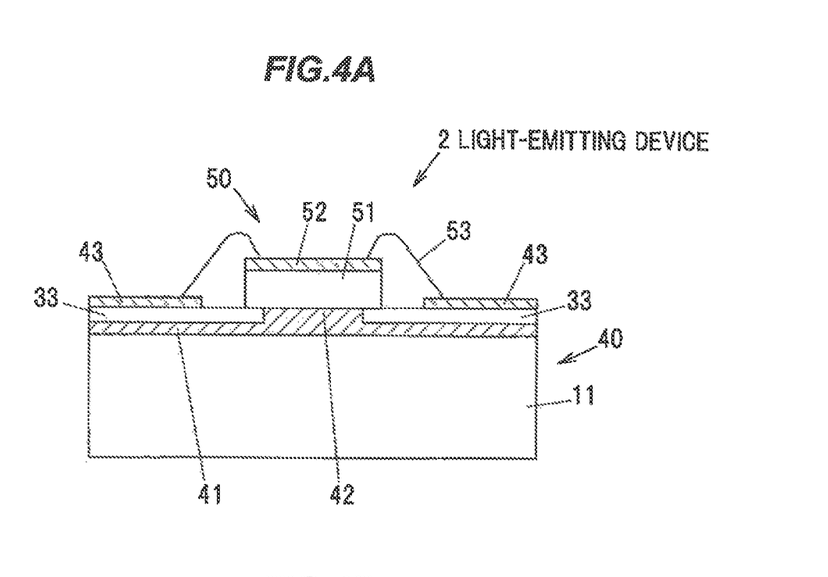
FIG. 4A is a vertical cross-sectional view showing a light-emitting device in the second embodiment.

FIG. 4A is a vertical cross-sectional view showing a light-emitting device 2 in the second embodiment.

The light-emitting device 2 has a circuit board 40 in which a wiring 41 having a raised portion 42 is provided on a surface of the substrate 11, a face-up light-emitting element 50 mounted on the raised portion 42 of the wiring 41, and a resin 33 as a white resist covering a surface of the circuit board 40.

Figure 4B:
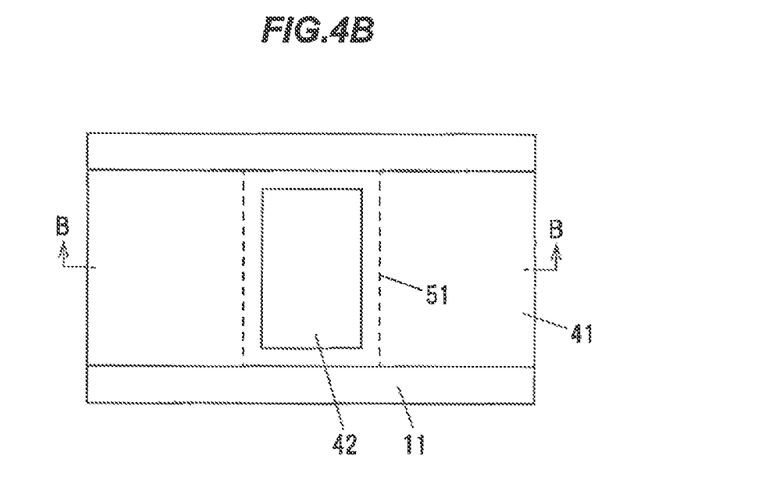
FIG. 4B is a top view showing the light-emitting device in the second embodiment.

FIG. 4B is a top view showing the light-emitting device 2 in the second embodiment. The cross section in FIG. 4A is taken on line B-B of FIG. 4B. FIG. 4B shows the state before arranging the light-emitting element 50, the resin 33 and electrodes 43. In addition, the position where an element substrate 51 of the light-emitting element 50 is to be located is indicated by a dotted line FIG. 4B.

The light-emitting element 50 is, e.g., a face-up LED chip which has an element substrate 51 and a crystal layer 52 having cladding layers and a light-emitting layer sandwiched therebetween. The light-emitting element 50 is mounted with the element substrate 51 facing toward the circuit board 40, so that electrodes (not shown) provided on the crystal layer 52 are connected to the electrodes 43 on the resin 33 via bonding wires 53. Alternatively, the light-emitting element 50 may be a light-emitting element other than LED chip and may be, e.g., a laser diode, etc.

The wiring 41 has the raised portion 42 to be bonded to the element substrate 51 of the light-emitting element 50, as described above. The wiring 41 is e.g. a heat dissipation wiring. A level difference between the light-emitting element 50 and the wiring 41 except the raised portion 42 is increased by mounting the light-emitting element 50 on the raised portion 42. In addition, the raised portion 42 is located inside the element substrate 51 when viewed from the top and a gap is thus formed between the element substrate 51 and the wiring 41 on the outer periphery side of the light-emitting element 50.

This makes easy to apply the resin 33 into a gap between the light-emitting element 50 and the circuit board 40 while preventing the resin 33 from climbing on the light-emitting element 50. Thus, it is possible to apply the resin 33 on the circuit board 40 so that the wiring 41 is not exposed between the light-emitting element 50 and the resin 33 when viewed from the top. The feature in this case is that the exposed portion of the bottom surface of the element substrate 51 on the outer periphery side of the light-emitting element 50 is covered with the resin 33. Normally, the side surfaces of the raised portion 42 are also covered with the resin 33.

The wiring 41 has a lower reflectance than the resin 33 used as a white resist. Therefore, the wiring 41, if exposed between the light-emitting element 50 and the resin 33 when viewed from the top, causes a decrease in luminous flux of the light-emitting device 2. For this reason, the resin 33 is applied so that the wiring 41 is not exposed between the light-emitting element 50 and the resin 33 when viewed from the top, which results in that a decrease in luminous flux of the light-emitting device 2 can be suppressed.

The resin 33 is formed of, e.g., a resin, such as silicone-based resin or epoxy-based resin, which contains a white filler.

The element substrate 51 of the light-emitting element 50 is bonded to the raised portion 42 of the wiring 41 by, e.g., an adhesive such as silicone-based resin or epoxy-based resin.

The light-emitting element 50 may be sealed with a transparent sealing resin such as silicone-based resin or epoxy-based resin. This sealing resin may additionally contain a phosphor.

Method of Manufacturing the Light-Emitting Device

An example of the method of manufacturing the light-emitting device 2 will be described below.

FIGS. 5A to 5D, 6A and 6B are vertical cross-sectional views showing a process of manufacturing the light-emitting device 2 in the second embodiment.

Figure 5A:
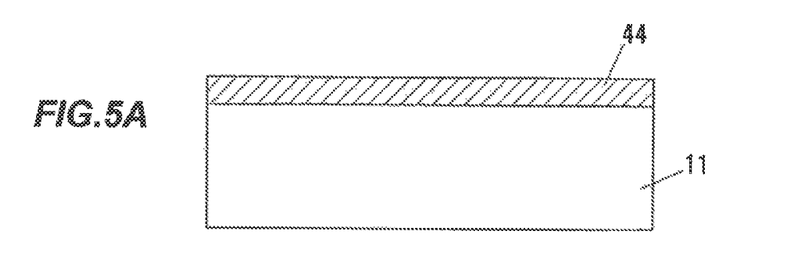
FIGS. 5A to 5D are vertical cross-sectional views showing a process of manufacturing the light-emitting device in the second embodiment.

Firstly, as shown in FIG. 5A, a metal film 44 such as Cu film is bonded onto the substrate 11. The metal film 44 may be formed by sputtering or CVD (chemical vapor deposition).

Figure 5B:
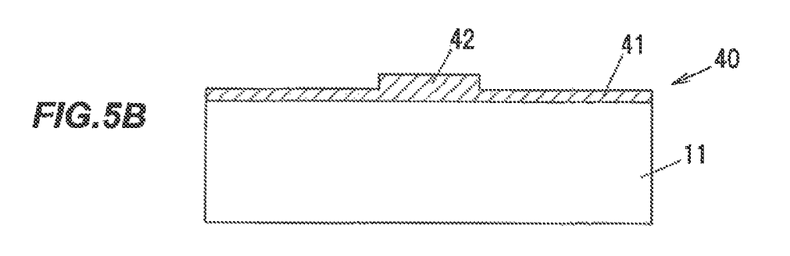

Next, as shown in FIG. 5B, the metal film 44 is processed by etching, etc., to form the wiring 41. The raised portion 42 of the wiring 41 is formed in this step.

Figure 5C:
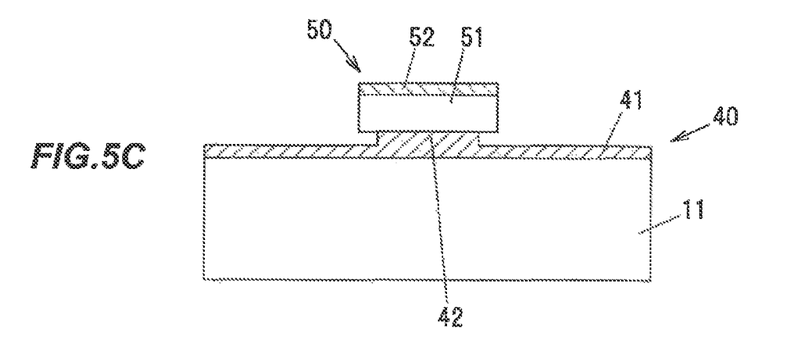

Next, as shown in FIG. 5C, the light-emitting element 50 is mounted on the raised portion 42 of the wiring 41.

Figure 5D:
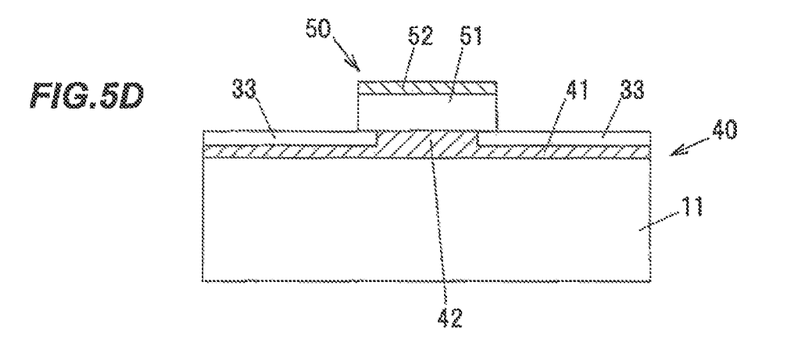

Next, as shown in FIG. 5D, the resin 33 as a resist is applied onto the circuit board 40 by potting, etc.

Figure 6A:
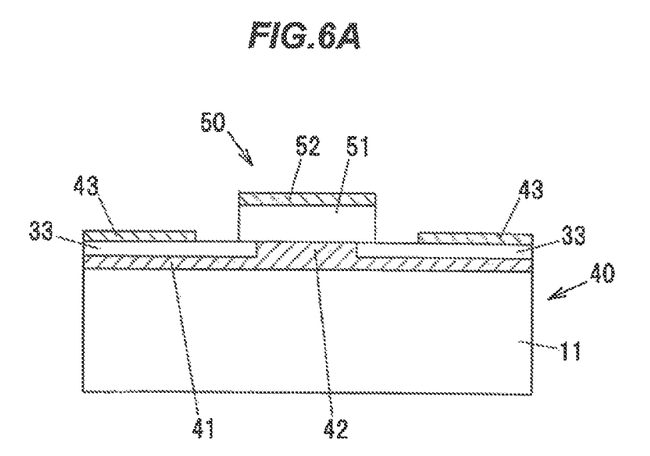
FIGS. 6A and 6B are vertical cross-sectional views showing the process of manufacturing the light-emitting device in the second embodiment.

Next, as shown in FIG. 6A, the electrodes 43 are formed on the resin 33 by sputtering, etc.

Figure 6B:
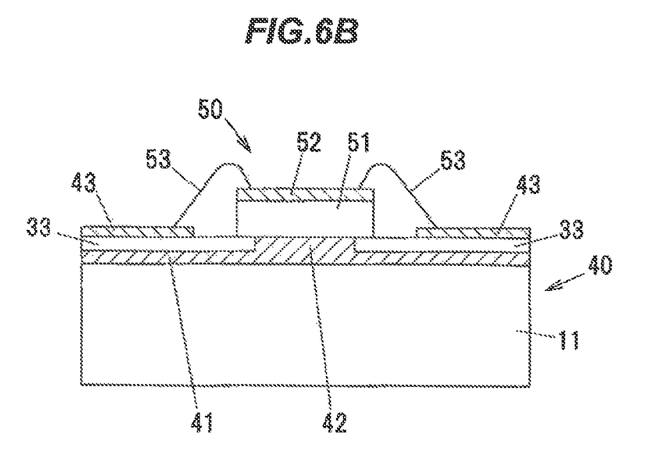

Next, as shown in FIG. 6B, electrodes of the light-emitting element 50 are connected to the electrodes 43 via the bonding wires 53, and the light-emitting device 2 is thereby obtained.

Effects of the Second Embodiment

In the second embodiment, a resin as a resist can be applied without exposing a wiring in the vicinity of a face-up light-emitting element and without climbing on the light-emitting element. As a result, it is possible to suppress a decrease in luminous flux of the light-emitting device.

Although the embodiments of the invention have been described, the invention is not intended to be limited to the embodiments and the various kinds of modifications can be implemented without departing from the gist of the invention.

In addition, the invention according to claims is not to be limited to the embodiments. Further, please note that all combinations of the features described in the embodiments are not necessary to solve the problem of the invention.

What is claimed is:

1. A light-emitting device, comprising:
a circuit board comprising a wiring on a surface of a substrate, the wiring comprising a raised portion; and
a light-emitting element mounted on the raised portion,
wherein the light-emitting element comprises a flip-chip type and includes a single light-emitting layer,
wherein element electrodes of the light-emitting element are connected to the raised portion such that an edge of the element electrodes on an outer periphery side of the light-emitting element is located outside of the raised portion in a top view,
wherein an exposed portion of a bottom surface of the element electrodes, exposed in a vicinity of the outer periphery of the light-emitting element, is covered with a white or transparent resin,
wherein another resin is disposed below the light-emitting element and between the element electrodes of the light-emitting element, and
wherein, outside an overlapping area of the light-emitting element with the circuit board in the top view, said another resin is further disposed contacting the surface of the substrate.

2. The light-emitting device according to claim 1, wherein upper and side surfaces of the light-emitting element are covered with a phosphor layer.

3. The light-emitting device according to claim 2, wherein the white or transparent resin extends from the exposed portion of the bottom surface of the element electrodes to an exposed portion of a bottom surface of the phosphor layer.

4. The light-emitting device according to claim 2, wherein the white or transparent resin continuously extends from the exposed portion of the bottom surface of the element electrodes to an exposed portion of a bottom surface of the phosphor layer.

5. The light-emitting device according to claim 2, wherein the white or transparent resin is in a direct contact with the bottom surface of the element electrodes and a bottom surface of the phosphor layer.

6. The light-emitting device according to claim 1, wherein the wiring further comprises an other raised portion that constitutes a sidewall of a groove as well as the raised portion.

7. The light-emitting device according to claim 6, wherein the other raised portion is provided on an edge of the wiring where the raised portion is not provided.

8. The light-emitting device according to claim 1, wherein the white or transparent resin extends from the exposed portion of the bottom surface of the element electrodes to an upper surface of the wiring.

9. The light-emitting device according to claim 1, wherein the white or transparent resin continuously extends from the exposed portion of the bottom surface of the element electrodes to an upper surface of the wiring.

10. The light-emitting device according to claim 1, wherein the white or transparent resin is disposed on the bottom surface of element electrodes.

11. The light-emitting device according to claim 1, wherein, outside the overlapping area of the light-emitting element with the circuit board, in a stacking direction of the wiring on the substrate, said another resin extends through an entirety of the wiring to abut the surface of the substrate.

12. A method of manufacturing a light emitting device, the method comprising:
forming a raised portion in a wiring on a surface of a circuit board; and
mounting a light-emitting element on the raised portion, wherein the light-emitting element comprises a flip-chip type and includes a single light-emitting layer, wherein element electrodes of the light-emitting element are connected to the raised portion such that an edge of the element electrodes on an outer periphery side of the light-emitting element is located outside of the raised portion in a top view, wherein an exposed portion of a bottom surface of the element electrodes, exposed in a vicinity of the outer periphery of the light-emitting element, is covered with a white or transparent resin, wherein another resin is disposed below the light-emitting element and between the element electrodes of the light-emitting element, and wherein, outside an overlapping area of the light-emitting element with the circuit board in the top view, said another resin is further disposed contacting a surface of the circuit board.

13. The method according to claim 12, further comprising covering upper and side surfaces of the light-emitting element with a phosphor layer.

14. The method according to claim 13, wherein the white or transparent resin continuously extends from the exposed portion of the bottom surface of the element electrodes to an exposed portion of a bottom surface of the phosphor layer.

15. The method according to claim 12, further comprising forming in the wiring an other raised portion that constitutes a sidewall of a groove as well as the raised portion.

16. The method according to claim 15, wherein the other raised portion is provided on an edge of the wiring where the raised portion is not provided.

17. The method according to claim 12, wherein the white or transparent resin continuously extends from the exposed portion of the bottom surface of the element electrodes to an upper surface of the wiring.

18. The method according to claim 12, wherein, in a cross-sectional view, the second portion of said another resin is embedded in the wiring such that the wiring is disposed on opposing side surfaces of the second portion of said another resin.

19. The method according to claim 18, wherein, in the cross-sectional view, a first portion of the wiring, a first portion of said another resin, a second portion of the wiring, the white or transparent resin, an element electrode of the element electrodes, and a second portion of said another resin are sequentially arranged on the surface of the circuit board.

20. A light-emitting device, comprising:
a circuit board comprising a wiring on a surface of a substrate, the wiring comprising a raised portion; and
a light-emitting element mounted on the raised portion,
wherein the light-emitting element comprises a flip-chip type and includes a single light-emitting layer,
wherein element electrodes of the light-emitting element are connected to the raised portion such that an edge of the element electrodes on an outer periphery side of the light-emitting element is located outside of the raised portion in a top view,
wherein an exposed portion of a bottom surface of the element electrodes, exposed in a vicinity of the outer periphery of the light-emitting element, is covered with a white or transparent resin,
wherein another resin is disposed below the light-emitting element and between the element electrodes of the light-emitting element,
wherein, in a cross-sectional view, said another resin is embedded in the wiring such that the wiring s is disposed on opposing side surfaces of said another resin, and
wherein, in the cross-sectional view, a first portion of the wiring, a first portion of said another resin, a second portion of the wiring, the white or transparent resin, an element electrode of the element electrodes, and a second portion of said another resin are sequentially arranged on the surface of the substrate.

* * * * *